(12) United States Patent
Li et al.

(10) Patent No.: US 12,119,045 B2
(45) Date of Patent: Oct. 15, 2024

(54) MEMORY ARRAY LAYERS WITH ALTERNATING SENSE AMPLIFIER LAYERS

(71) Applicant: CHANGXIN MEMORY TECHNOLOGIES, INC., Anhui (CN)

(72) Inventors: Hongwen Li, Anhui (CN); Weibing Shang, Anhui (CN); Liang Zhang, Anhui (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 190 days.

(21) Appl. No.: 17/806,077

(22) Filed: Jun. 8, 2022

(65) Prior Publication Data

US 2023/0186968 A1 Jun. 15, 2023

(30) Foreign Application Priority Data

Dec. 15, 2021 (CN) .......................... 202111539945.7

(51) Int. Cl.
*G11C 11/408* (2006.01)
*G11C 5/06* (2006.01)
*G11C 11/4091* (2006.01)
*G11C 11/4094* (2006.01)
(Continued)

(52) U.S. Cl.
CPC .......... *G11C 11/4085* (2013.01); *G11C 5/063* (2013.01); *G11C 11/4091* (2013.01); *G11C 11/4094* (2013.01); *G11C 11/4096* (2013.01); *G11C 11/4097* (2013.01)

(58) Field of Classification Search
CPC . G11C 11/4085; G11C 5/063; G11C 11/4091; G11C 11/4094; G11C 11/4096; G11C 5/025; G11C 7/12; G11C 8/10; G11C 11/4097; G11C 7/18; G11C 11/401; G11C 8/08; Y02D 10/00
See application file for complete search history.

(56) References Cited

U.S. PATENT DOCUMENTS

| | | | |
|---|---|---|---|
| 6,535,451 B2 | 3/2003 | Sekiguchi et al. | |
| 8,406,073 B1 * | 3/2013 | Somasekhar | G11C 7/065 365/230.03 |
| 10,497,427 B2 | 12/2019 | Kim et al. | |

(Continued)

FOREIGN PATENT DOCUMENTS

GB 2239540 A 7/1991

*Primary Examiner* — Donald H B Braswell
(74) *Attorney, Agent, or Firm* — Syncoda LLC; Feng Ma

(57) ABSTRACT

A memory includes: bit lines extending along a first direction and word lines extending along a second direction; a plurality of memory modules arranged along the first direction; a column selection circuit and a read-write control driver circuit, wherein the column selection circuit and the read-write control driver circuit are located on a same side of the plurality of memory modules perpendicular to the first direction; column-select lines extending along the first direction and column connection lines extending along a third direction, wherein each of the column-select lines is electrically connected to an amplification unit arranged along the first direction and is electrically connected to the column selection circuit through the column connection line, and the column selection circuit is configured to drive the amplification unit electrically connected to the column-select line.

20 Claims, 11 Drawing Sheets

(51) Int. Cl.
*G11C 11/4096* (2006.01)
*G11C 11/4097* (2006.01)

(56) References Cited

U.S. PATENT DOCUMENTS

| | | | |
|---|---|---|---|
| 2002/0114201 A1* | 8/2002 | Aikawa | G11C 29/808 |
| | | | 365/200 |
| 2002/0141228 A1* | 10/2002 | Fujino | G11C 7/18 |
| | | | 257/E21.656 |
| 2003/0218901 A1 | 11/2003 | Ooishi et al. | |
| 2017/0076773 A1 | 3/2017 | Noguchi et al. | |
| 2019/0341091 A1* | 11/2019 | Sity | G11C 11/1655 |

* cited by examiner

MEMORY ARRAY LAYERS WITH ALTERNATING SENSE AMPLIFIER LAYERS

CROSS-REFERENCE TO RELATED APPLICATION

This application claims priority to Chinese Patent Application No. 202111539945.7 filed on Dec. 15, 2021, the disclosure of which is hereby incorporated by reference in its entirety.

BACKGROUND

Semiconductor memories can be classified into non-volatile memories and volatile memories. As a volatile memory, a dynamic random access memory (DRAM) has a high storage density, a fast read-write speed, and other advantages. The DRAM is widely used in various electronic systems. With the more advanced process technologies, storage performance of a memory needs to be further improved.

SUMMARY

Embodiments of the present disclosure relate to the technical field of semiconductors, and in particular, to a memory.

According to some embodiments of the present disclosure, an embodiment of the present disclosure provides a memory, including: bit lines (BLs) extending along a first direction and word lines (WLs) extending along a second direction; a plurality of memory modules arranged along the first direction, wherein each of the plurality of memory modules includes a memory array and an amplifier array that are arranged along the first direction, the memory array includes at least one memory cell, the amplifier array includes at least one amplification unit, each of the BLs is electrically connected to one terminal of a corresponding amplification unit, and each of the WLs is electrically connected to a corresponding memory cell; a column selection circuit and a read-write control driver circuit, wherein the column selection circuit and the read-write control driver circuit are located on a same side of the plurality of memory modules perpendicular to the first direction; column-select lines (CSLs) extending along the first direction and column connection lines (CCLs) extending along a third direction, wherein each of the CSLs is electrically connected to the amplification unit arranged along the first direction and is electrically connected to the column selection circuit through the CCL, and the column selection circuit is configured to drive the amplification unit electrically connected to the CSL; and a global data line extending along the first direction and a global connection line (GCL) extending along the third direction, wherein the global data line is electrically connected to the read-write control driver circuit through the GCL, and the read-write control driver circuit is configured to drive a memory module corresponding to the global data line to write data into the memory cell through the global data line, or to read data from the memory cell and transmit the data to the global data line.

BRIEF DESCRIPTION OF THE DRAWINGS

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

Figure 1:
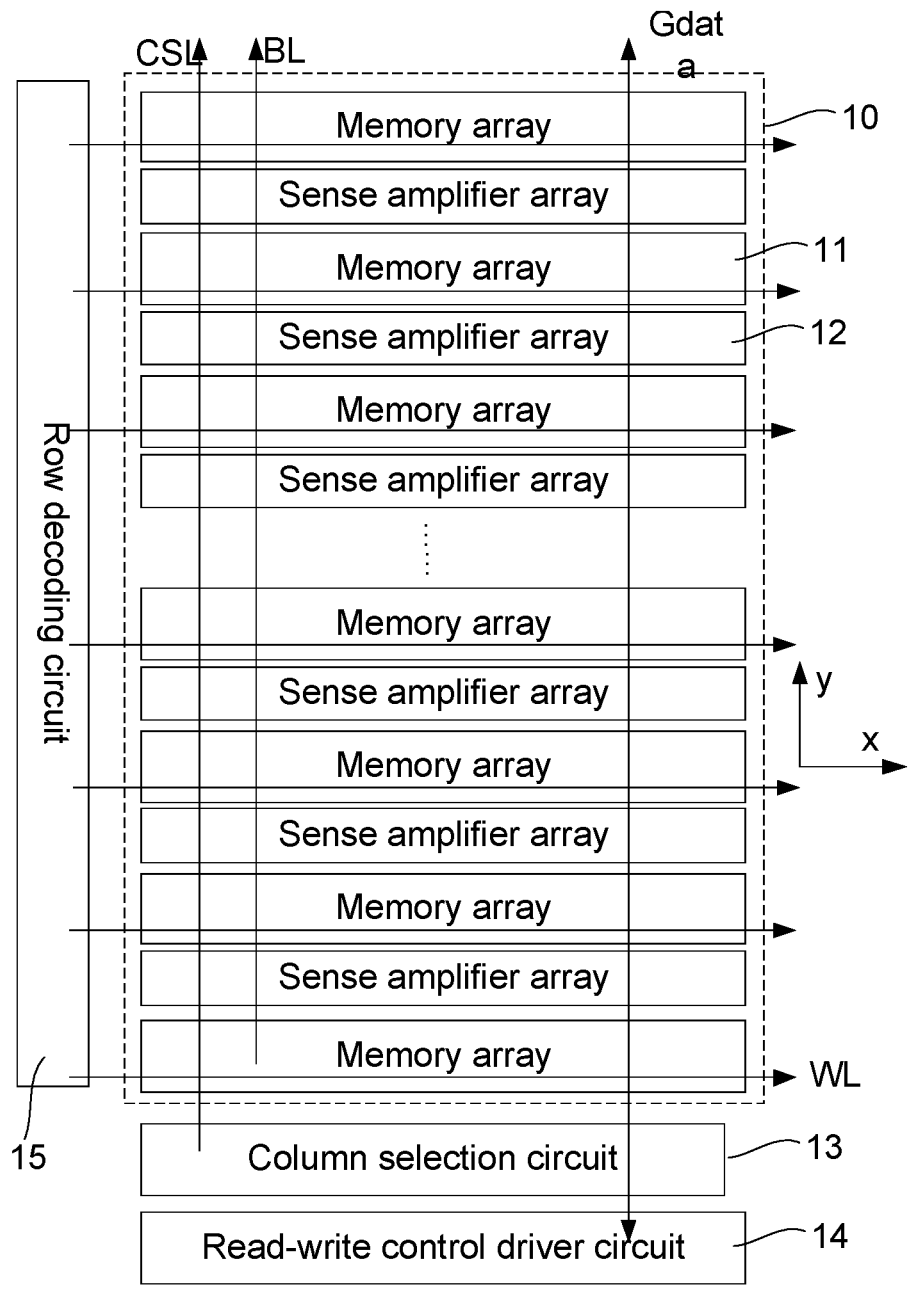
FIG. 1 is a schematic structural diagram of a memory.

FIG. 1 is a schematic structural diagram of a memory. Referring to FIG. 1, the memory includes: a plurality of memory banks 10, wherein each of the plurality of memory banks 10 includes a plurality of memory modules, each of the plurality of memory modules (also referred to as sections) includes a memory array 11 and a sense amplifier array 12, the memory array 11 includes a plurality of memory cells arranged along an x direction, the sense amplifier array 12 includes a plurality of amplification units arranged along the x direction, a memory cell and an amplification unit that are located in a same column constitute a section, and it can be understood that a column is defined to be along a y direction and a row is defined to be along the x direction; a read-write control driver circuit 14, a column selection circuit (ydec) 13, and a row decoding circuit 15; a plurality of WLs extending along the x direction, wherein each of the plurality of WLs is connected to a memory array 11 of a corresponding row; a plurality of BLs extending along the y direction, wherein each of the plurality of BLs is connected to a memory array 11 of a corresponding column; CSLs extending along the y direction, wherein each of the CSLs is connected to an amplification unit of a sense amplifier array 12 of a corresponding column; and a global data line Gdata extending along the y direction, wherein the global data line is electrically connected to the amplification unit and the read-write control driver circuit 14, the read-write control driver circuit 14 is configured to drive a memory module corresponding to the global data line Gdata, and the row decoding circuit 15 is configured to provide a voltage to a WL to enable the WL.

In the above memory, the read-write control driver circuit 14 is located on one side of each of the plurality of memory banks 10, and the row decoding circuit 15 is located on another side of each of the plurality of memory banks 10, which restricts a size and a shape of a chip to a certain extent and affects packaging of the chip or optimization of manufacturing efficiency. In addition, in the above memory, RC delays of driving different memory modules by the read-write control driver circuit 14 are quite different. Specifically, a memory module closest to the read-write control driver circuit 14 is defined as a first memory module, and a memory module furthest away from the read-write control driver circuit 14 is defined as a second memory module. A connection node between a global data line Gdata and the first memory module is far away from a connection node between the global data line Gdata and the second memory module. As a result, there is a large difference between time delays when the read-write control driver circuit drives the first memory module and the second memory module, and the read-write control driver circuit 14 needs to take a long time to drive the second memory module, causing an adverse impact on a read-write speed of the memory.

In addition, in the above memory, RC delays of driving different memory modules by the column selection circuit 13 are quite different. Specifically, the CSL provides a column selection signal, the memory module closest to the read-write control driver circuit 14 is defined as the first memory module, and the memory module furthest away from the read-write control driver circuit 14 is defined as the second storage module. A path of transmitting the column selection signal to the first memory module is greatly different from that of transmitting the column selection signal to the second memory module, which causes a large difference between time at which the column selection signal reaches the two memory modules, resulting in a signal delay and affecting normal operation of the memory.

The embodiments of the present disclosure provide a memory in which a read-write control driver circuit and a column selection circuit are arranged on one side perpendicular to an arrangement direction of a plurality of memory modules, to solve an RC delay problem, make a chip design more flexible, and improve storage performance of the memory.

In order to make the objectives, technical solutions and advantages of the embodiments of the present disclosure clearer, the embodiments of the present disclosure are described below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 2:
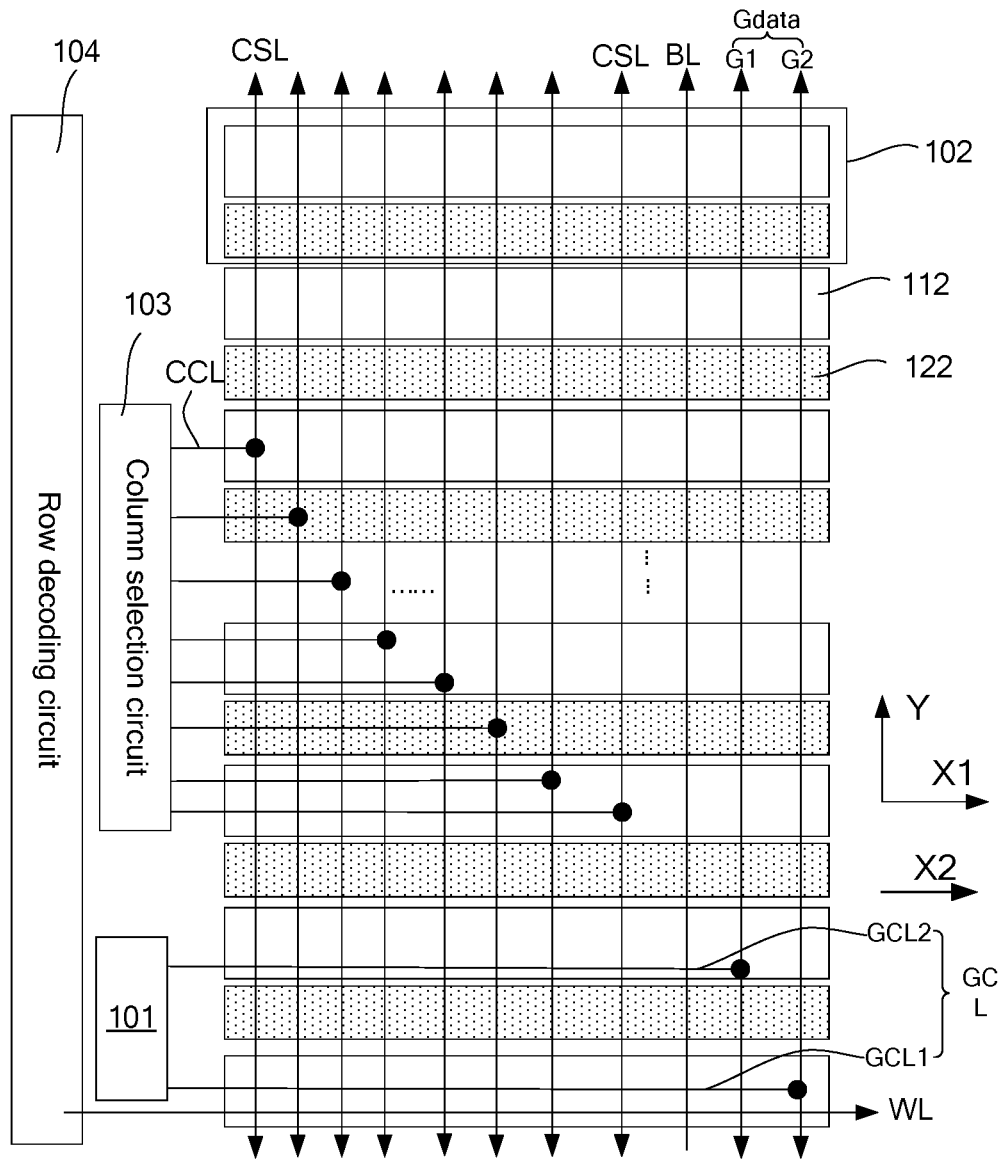
FIG. 2 is a schematic structural diagram of a memory according to some embodiments of the present disclosure.
Figure 3:
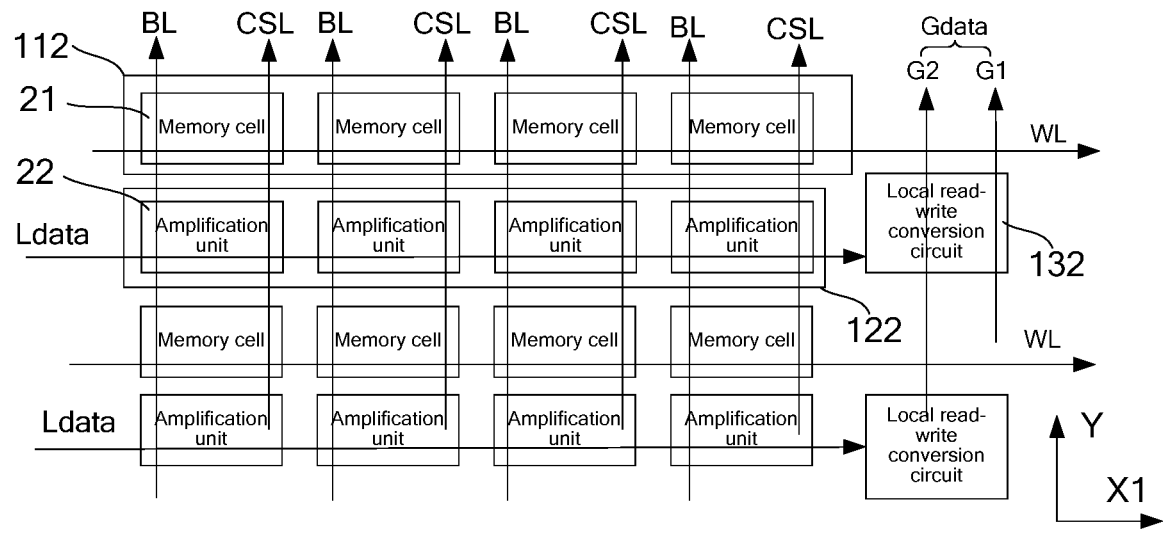
FIG. 3 is a schematic structural diagram of a memory module of a memory according to some embodiments of the present disclosure.
Figure 4:
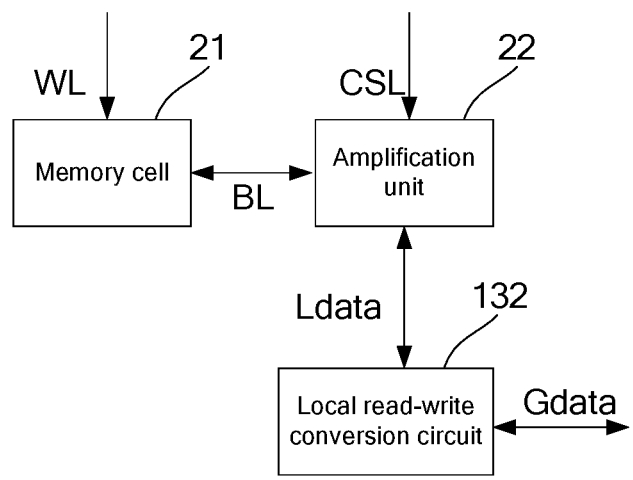
FIG. 4 is a schematic diagram of a circuit structure of an amplification unit and a memory cell of a memory according to some embodiments of the present application.
Figure 5:
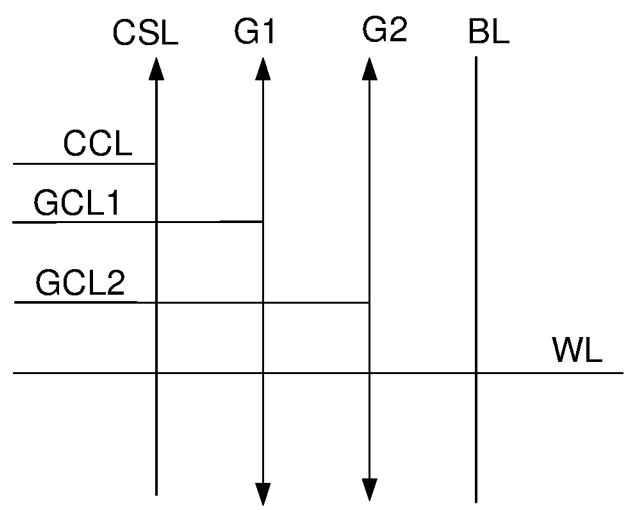
FIG. 5 is a schematic layout diagram of data lines in a memory according to some embodiments of the present disclosure.

FIG. 2 is a schematic structural diagram of a memory according to some embodiments of the present disclosure, FIG. 3 is a schematic structural diagram of a memory module of a memory according to some embodiments of the present disclosure, FIG. 4 is a schematic diagram of a circuit structure of an amplification unit and a memory cell of a memory according to some embodiments of the present disclosure, FIG. 5 is a schematic layout diagram of data lines in a memory according to some embodiments of the present disclosure, and FIG. 6 to FIG. 12 are schematic structural diagrams of a memory according to some embodiments of the present disclosure.

Referring to FIG. 2 and FIG. 3, an embodiment of the present disclosure provides a memory, including: BLs extending along a first direction Y and WLs extending along a second direction X1; a plurality of memory modules 102 arranged along the first direction Y, wherein each of the plurality of memory modules 102 includes a memory array 112 and an amplifier array 122 that are arranged along the first direction Y, the memory array 112 includes at least one memory cell 21, the amplifier array 122 includes at least one amplification unit 22, each of the BLs is electrically connected to one terminal of a corresponding amplification unit 22, and each of the WLs is electrically connected to a corresponding memory cell 21; a column selection circuit 103 and a read-write control driver circuit 101, wherein the column selection circuit 103 and the read-write control driver circuit 101 are located on a same side of the plurality of memory modules 102 perpendicular to the first direction Y; CSLs extending along the first direction Y and CCLs extending along a third direction X2, wherein each of the CSLs is electrically connected to the amplification unit 22 arranged along the first direction Y and is electrically connected to the column selection circuit 103 through the CCL, and the column selection circuit 103 is configured to drive the amplification unit 22 electrically connected to the CSL; and a global data line Gdata extending along the first direction Y and a GCL extending along the third direction X2, wherein the global data line Gdata is electrically connected to the read-write control driver circuit 101 through the GCL, and the read-write control driver circuit 101 is configured to drive a memory module 102 corresponding to the global data line Gdata to write data into the memory cell 21 through the global data line Gdata, or to read data from the memory cell 21 and transmit the data to the global data line Gdata.

It should be noted that only one BL and one WL are shown in FIG. 2. In fact, the memory includes a plurality of BLs and a plurality of WLs. In FIG. 3, only one BL and one CSL are shown in one memory cell. In fact, a plurality of BLs and a plurality of CSLs are connected in one memory cell.

In the above embodiment, the column selection circuit 103 and the read-write control driver circuit 101 are not located on an arrangement direction of the plurality of memory modules 102, such that a shape and a size of the memory can be adjusted more flexibly and manufacturing efficiency can be optimized. Moreover, an arrangement direction of the read-write control driver circuit 101 and the arrangement direction of the plurality of memory modules 102 are different from an extension direction of the global data line Gdata. In this way, signal transmission paths required by the read-write control driver circuit 101 to drive different memory modules 102 are only slightly different, so as to solve an RC delay problem and improve a read-write speed. In addition, in the above memory, different memory modules 102 can be driven by the read-write control driver circuit 101 through the GCL. This is conducive to reducing structural complexity of the read-write control driver circuit 101, a size of the read-write control driver circuit 101, and chip area of the memory.

Moreover, a difference between time at which a column selection signal transmitted by a same CSL reaches different amplification units 22 can be reduced, so as to solve the RC delay problem and improve the read-write speed. In addition, in the above memory, different CSLs have an opportunity to transmit a same column selection signal through the CCL, that is, the column selection circuit 103 does not need to provide a circuit structure separately for each of the CSLs. This can reduce structural complexity of the column selection circuit 103, a size of the column selection circuit 103, and the chip area of the memory.

In some embodiments, the memory may be a DRAM, for example, a double data rate (DRR) 4 DRAM or a DDR5 DRAM. In other embodiments, the memory may alternatively be a static random access memory (SRAM), a NAND memory, a NOR memory, a FeRAM, or a PcRAM.

Referring to FIG. 3, FIG. 3 is a detail of two adjacent memory modules 102 in FIG. 2. Each of the two adjacent memory modules 102 is referred to as a section. The memory array 112 may include a plurality of memory cells 21 arranged along the second direction X1, and the amplifier array 122 may include a plurality of amplification units 22 arranged along the second direction X1. In some embodiments, each of the plurality of amplification units 22 may be electrically connected to one memory cell 21 in a same memory module 102 to amplify data read from the memory cell 21 or data to be stored into the memory cell 21 during a read operation. In other embodiments, each of the plurality of amplification units 22 may alternatively be electrically connected to one memory cell 21 in an adjacent memory module 102 to amplify data read from the memory cell 21 or data to be stored into the memory cell 21 during a read operation. It can be understood that this embodiment of the present disclosure does not particularly limit an electrical connection correspondence between the memory cell and the amplification unit in the memory module, provided that the amplification unit can amplify the data to be stored into the memory cell or the data read from the memory cell.

In some embodiments, the memory cell 21 may be a DRAM memory cell.

Referring to FIG. 4, FIG. 4 is a schematic diagram of functional modules of the amplification unit 22 and the memory cell 21. The amplification unit 22 is also referred to as a first sense amplifier (FSA). The amplification unit 22 has a control terminal, a first terminal, and a second terminal. The control terminal is electrically connected to the CSL to receive the column selection signal, the first terminal is electrically connected to the BL, and the second terminal is electrically connected to a local data line Ldata. The memory cell 21 is electrically connected to the WL and the BL. If the WL is enabled, the memory cell 21 electrically connected to the WL can perform a read operation, and data is transmitted between the corresponding memory cell 21 and the BL. Specifically, when the control terminal receives the column selection signal, the amplification unit 22 can amplify data, and the first terminal and the second terminal are turned on to transmit the data between the BL and the local data line Ldata.

The BLs are electrically connected to memory cells 21 arranged along the first direction Y in a plurality of memory arrays 112, and a same BL is electrically connected to a column of memory cells 21 arranged along the first direction Y. It can be understood that the BL can be presented as a bus, and the same BL is a same BL bus.

The WLs are electrically connected to memory cells 21 arranged along the second direction X1 in the plurality of memory arrays 112, and a same WL is electrically connected to a row of memory cells 21 arranged along the second direction X1 in a same memory array 112. It can be understood that the WL can be presented as a bus, and the same WL is a same WL bus.

The column selection circuit 103, commonly referred to as a YDEC circuit, is configured to provide the column selection signal for the amplification unit 22 to select the amplification unit 22 to transmit the data between the BL and the local data line Ldata. The CSL is electrically connected to the column selection circuit 103 through the GCL, and is configured to provide the column selection signal for a control terminal of a corresponding amplification unit 22 to select the amplification unit 22, such that the amplification unit 22 realizes data transmission and amplification.

The GCL is configured to electrically connect the read-write control driver circuit 101 and the global data line Gdata, such that the read-write control driver circuit 101 is electrically connected to a corresponding memory module 102. In some embodiments, the third direction X2 may be the same as the second direction X1, in other words, an extension direction of the GCL may be the same as that of the WL, and the first direction Y may be perpendicular to the third direction X2. In this way, a length of the GCL can be as short as possible, such that a path required by the read-write control driver circuit 101 to drive the memory module 102 can be as short as possible, which is conducive to further improving read-write performance of the memory. In addition, a length of the CCL can be as short as possible, such that a transmission path of the column selection signal can be as short as possible, which is conducive to further improving the read-write performance of the memory.

Each memory module 102 arranged along the first direction Y may be defined as a section. In some embodiments, the read-write control driver circuit 101 may be arranged in the middle of one side of the plurality of memory modules 102, which is conducive to further reducing a difference between signal transmission time required by the read-write control driver circuit 101 to drive head-end and tail-end sections, so as to further improve overall performance of the memory.

As previously analyzed, in some embodiments, the memory may further include local data lines Ldata. Each of the local data lines extends along the second direction X1, and a same local data line is electrically connected to second terminals of amplification units 22 in a same amplifier array 122. It can be understood that one amplifier array 122 may be connected to a plurality of local data lines Ldata.

The CSL is configured to turn on a plurality of BLs in a same section and a corresponding local data line Ldata. Each section includes a plurality of CSLs, and may further include a conventional CSL and a redundant CSL. When the memory operates, one CSL in each section is selected and turned on.

In some embodiments, the memory may further include a complementary BL. Accordingly, the memory may further include a local complementary data line.

In some embodiments, referring to FIG. 3 and FIG. 4, the memory module 102 may further include a local read-write conversion circuit 132, and the local read-write conversion circuit 132 is electrically connected to the second terminal of the amplification unit 22. Specifically, the local read-write conversion circuit 132 is electrically connected to the second terminal of the amplification unit 22 through the local data line. The local read-write conversion circuit 132 is configured to implement data transmission between the local data line and the global data line Gdata. More specifically, a same global data line Gdata can be electrically connected to a plurality of local read-write conversion circuits 132. That the read-write control driver circuit 101 drives the memory module 102 means that, in a writing stage, the read-write control driver circuit 101 drives the local read-write conversion circuit 132 corresponding to the memory module 102 to perform data transmission from the local data line to the global data line Gdata, and in a reading stage, the read-write control driver circuit 101 drives the local read-write conversion circuit 132 corresponding to the memory module 102 to perform data transmission from the global data line Gdata to the local data line.

Referring to FIG. 3, the local read-write conversion circuit 132 may be arranged on one side of the amplifier array 122, and the local read-write conversion circuit 132 of each of the plurality of memory modules 102 is arranged on a same side of a corresponding amplifier array 122. In this way, a length of the global data line Gdata can be reduced and the read-write speed can be improved. In other embodiments, the local read-write conversion circuit 132 may be arranged inside the amplifier array 122, in other words, between any adjacent amplification units 22, and local read-write conversion circuits 132 of different memory modules 102 are arranged in a same position of corresponding amplifier arrays 122. For example, the local read-write conversion circuit 132 of each of the plurality of memory modules 102 is arranged between a fifth amplification unit 22 and a sixth amplification unit 22, or the local read-write conversion circuit 132 of each of the plurality of memory modules 102 is arranged between a tenth amplification unit 22 and an eleventh amplification unit 22.

Referring to FIG. 5, FIG. 5 is a schematic layout diagram of data lines in the memory according to this embodiment of the present disclosure. The data lines include the global data line Gdata, the GCL, the CSL, the BL, and the WL. Directions of the BL, the global data line Gdata, and the CSL are the same, and directions of the GCL and the WL are the same.

In some embodiments, referring to FIG. 2, the memory may further include a row decoding circuit 104. The row decoding circuit 104 is configured to select, based on the WL, the memory cell 21 electrically connected to the WL, such that the memory cell 21 electrically connected to the WL performs read and write operations. Specifically, the row decoding circuit 104 and the read-write control driver circuit 101 may be located on a same side of the plurality of memory modules 102, and the row decoding circuit 104 may be located on one side of the column selection circuit 103 and the read-write control driver circuit 101 as a whole far away from the plurality of memory modules 102.

In some embodiments, the row decoding circuit 104 and the read-write control driver circuit 101 may be located at a same layer of the memory. In other embodiments, the row decoding circuit 104 and the read-write control driver circuit 101 may be located at different layers of the memory. For example, in a semiconductor structure of the memory, the row decoding circuit 104 and the read-write control driver circuit 101 may be formed by a same semiconductor material layer and/or metal layer, or by different semiconductor material layers and/or metal layers.

In some embodiments, the column selection circuit 103 and the read-write control driver circuit 101 may be arranged along the first direction Y. In other words, arrangement directions of the column selection circuit 103 and the read-write control driver circuit 101 may be the same as the arrangement direction of the plurality of memory modules 102, which is conducive to reducing a size of the memory in a direction perpendicular to the first direction Y.

In some embodiments, as shown in FIG. 2, each of the CSLs may be electrically connected to a plurality of columns of amplification units 22 arranged along the first direction Y. In other words, each of the CSLs is electrically connected to a plurality of columns of amplification units 22 arranged along the first direction Y in a same section, and a quantity of the CSLs may be the same as that of sections.

Figure 6:
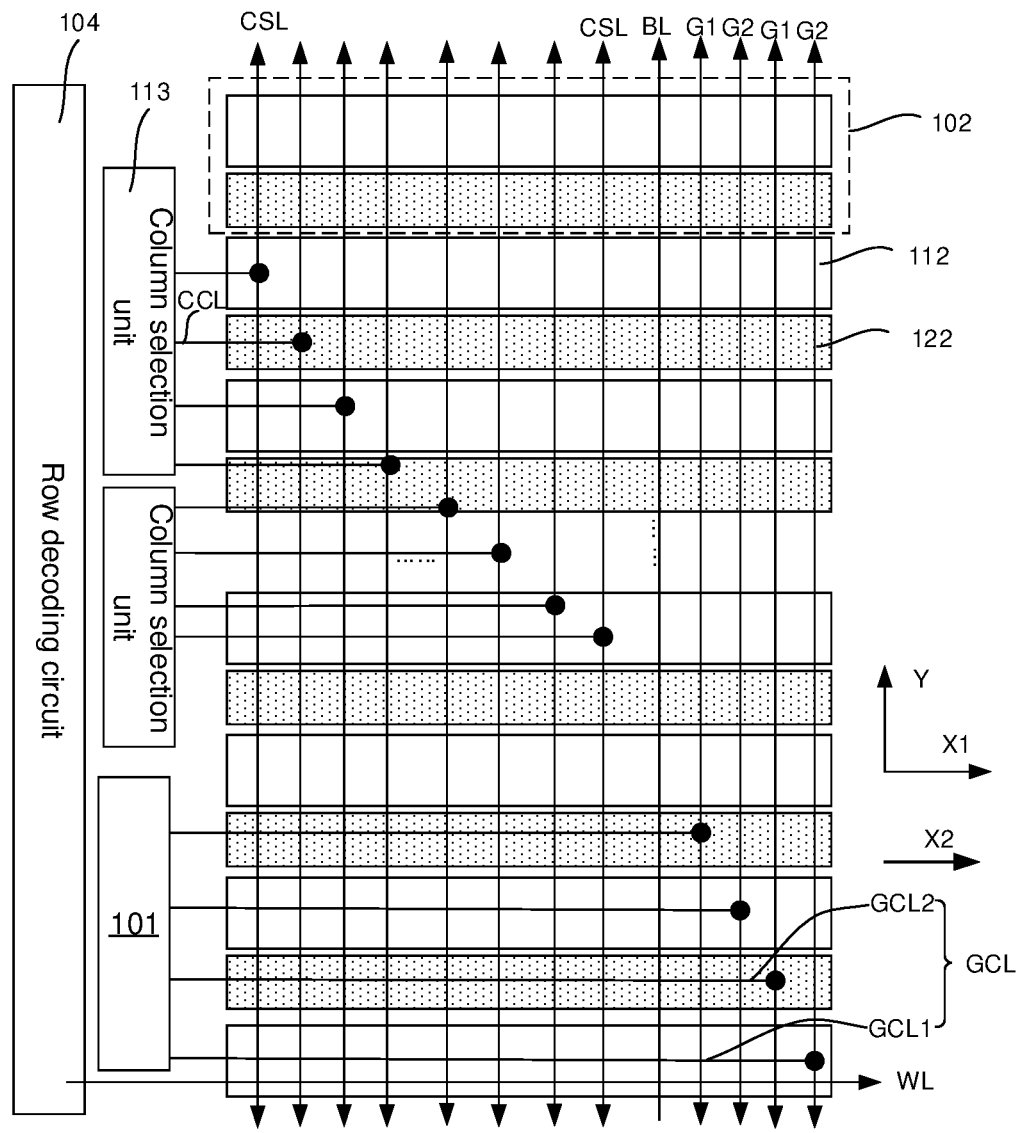
FIG. 6 is a first different schematic structural diagram of a memory according to an embodiment of the present disclosure.

In some embodiments, referring to FIG. 6, FIG. 6 is a different schematic structural diagram of the memory according to this embodiment of the present disclosure. The column selection circuit 103 may include a plurality of column selection units 113 arranged along the first direction Y, and each of the plurality of column selection units 113 is electrically connected to at least two of the CSLs through the CCL. In this way, a plurality of CSLs can share one column selection unit 113, and amplification units 22 connected to a plurality of CSLs can be driven by a same column selection unit 113. This can reduce circuit complexity of the column selection circuit 103 and the chip area.

In some embodiments, each of the plurality of column selection units 113 may be electrically connected to at least two adjacent CSLs through the CCL. In this way, a same column selection unit 113 can be used to turn on BLs in adjacent sections, such that amplification units 22 in the adjacent sections have an amplification function, and amplification units 22 in different sections can share one column selection unit 113, which is conducive to reducing a quantity of column selection units 113 and the chip area. Each of the plurality of column selection units 113 may be electrically connected to at least two of the CSLs through a same CCL; or each of the plurality of column selection units 113 may be electrically connected to at least two of the CSLs through different CCLs.

In some embodiments, each of the plurality of column selection units 113 may be electrically connected to at least two CSLs distributed at intervals through the CCL. In this way, a same column selection unit 113 can be used to enable amplification units 22 in sections distributed at intervals, which is conducive to reducing a quantity of column selection units 113 and the chip area. Moreover, the CSLs distributed at intervals are electrically connected to a same column selection unit 113, which is conducive to avoiding signal interference between different CSLs and further improves the read-write performance of the memory. Each of the plurality of column selection units 113 may be electrically connected to at least two of the CSLs through a same CCL; or each of the plurality of column selection units 113 may be electrically connected to at least two of the CSLs through different CCLs.

In the first direction Y, the plurality of memory modules 102 are sorted by natural number in ascending order, a memory module 102 in an odd position is defined as a first memory module, and a memory module 102 in an even position is defined as a second memory module; and the global data line Gdata includes: a first global data line G1 corresponding to the first memory module, and a second global data line G2 corresponding to the second memory module. Referring to FIG. 6, the GCL includes: a second GCL (GCL2), wherein the GCL2 is electrically connected to the first global data line G1 and the read-write control driver circuit 101; and a first GCL (GCL1), wherein the GCL1 is electrically connected to the second global data line G2 and the read-write control driver circuit 101. The first global data line G1 and the second global data line G2 are independent of each other, and the GCL1 and the GCL2 are independent of each other. Both the GCL1 and the GCL2 extend along the third direction X2.

Specifically, in some embodiments, referring to FIG. 2, the first global data line G1 may correspond to all first memory modules, and the second global data line G2 may correspond to all second memory modules. That is, the read-write control driver circuit 101 can drive all the first memory modules at the same time through the first global data line G1, and the read-write control driver circuit 101 can drive all the second memory modules at the same time through the second global data line G2. This is conducive to reducing a quantity of first global data lines G1, a quantity of second global data lines G2, and power consumption of the memory.

In other embodiments, referring to FIG. 6, there may be a plurality of first global data lines G1 and a plurality of second global data lines G2, each of the plurality of first global data line G1 corresponds to some first memory modules, and each of the plurality of second global data lines G2 corresponds to some second memory modules. That is, the read-write control driver circuit 101 only needs to drive some first memory modules or some second memory modules each time, which is conducive to reducing load that needs to be driven by the read-write control driver circuit 101 each time and improving a signal transmission speed. For example, one first global data line G1 is connected to $1^{st}$, $5^{th}$, $9^{th}$, and $13^{th}$ memory modules 102, and one second global data line G2 is connected to $2^{nd}$, $6^{th}$, $10^{th}$, and $14^{th}$ memory modules 102; and another first global data line G1 is connected to $3^{rd}$, $7^{th}$ and $11^{th}$ memory modules 102, and another second global data line G2 is connected to $4^{th}$, $8^{th}$, and $12^{th}$ memory modules 102.

Figure 7:
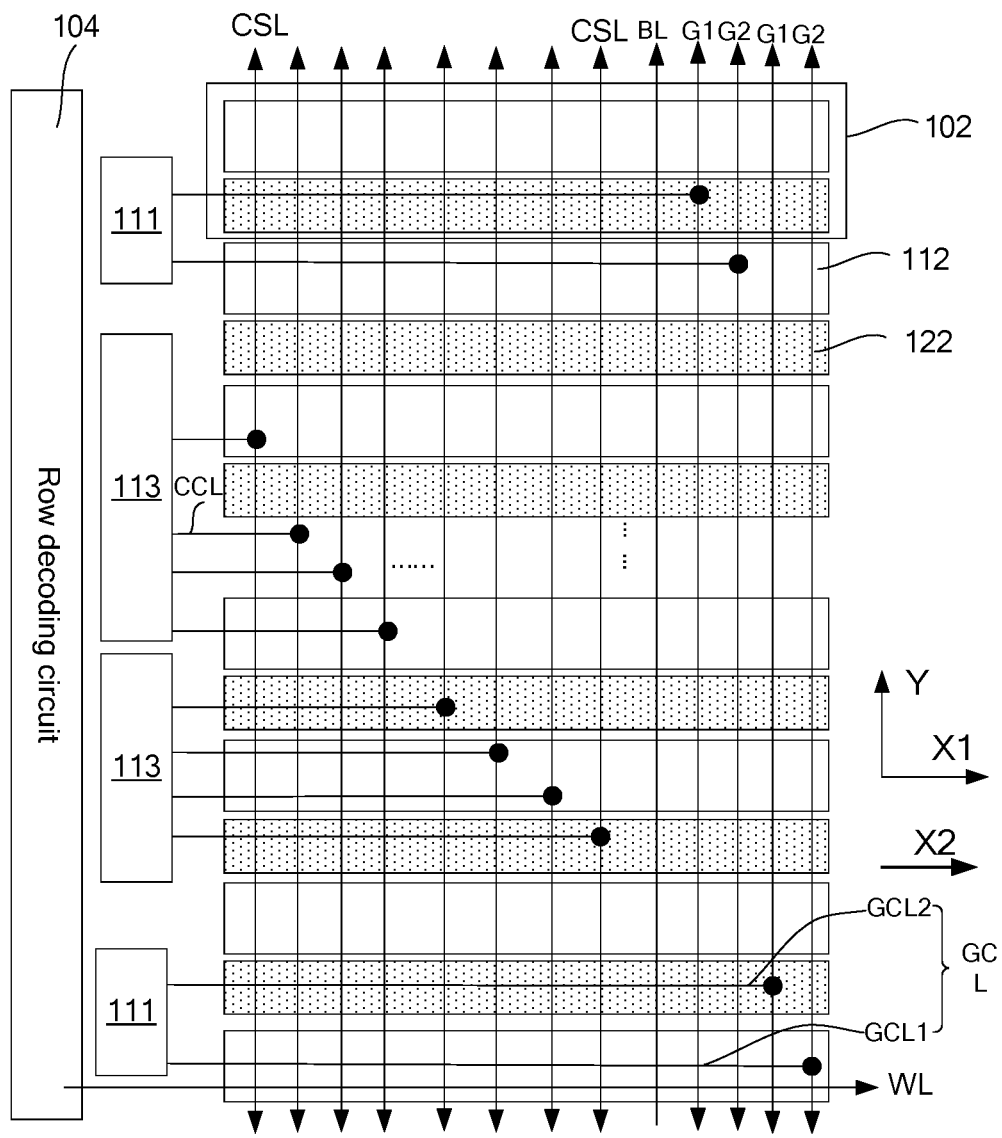
FIG. 7 is a second different schematic structural diagram of a memory according to an embodiment of the present disclosure.

In some embodiments, referring to FIG. 7, the read-write control driver circuit (not shown in the figure) may include a plurality of read-write control driving units 111 arranged along the first direction Y, wherein each of the plurality of read-write control driving units 111 is electrically connected to at least one of the plurality of first global data lines G1 and at least one of the plurality of second global data lines G2 through the GCL. In this way, different sections can be driven by different read-write control driving units 111, thereby realizing more flexible driving manners for different sections in the memory.

In some embodiments, global data lines Gdata electrically connected to different read-write control driving units 111 are distributed at intervals. For example, some global data lines Gdata are distributed at edges of the plurality of memory modules 102, and other global data lines Gdata are distributed in middle regions of the plurality of memory modules 102. Different global data lines Gdata are distributed at intervals, which can avoid signal interference between different global data lines Gdata and is conducive to further improving storage performance of the memory.

It can be understood that in some embodiments, there may be a plurality of global data lines Gdata, and all the global data lines Gdata may be distributed at the edges of the plurality of memory modules 102.

In addition, the plurality of read-write control driving units 111 may be located on both sides of all the column selection units 113; or the plurality of read-write control driving units 111 and the plurality of column selection units 113 may be alternately arranged at intervals.

In some embodiments, with reference to FIG. 3 and FIG. 8 to FIG. 12, wherein FIG. 8 to FIG. 12 are different schematic structural diagrams of the memory according to some embodiments of the present disclosure, the plurality of memory modules 102 may be divided into at least two module regions I arranged along the first direction Y, and each of the at least two module regions I includes at least two of the plurality of memory modules 102.

Figure 8:
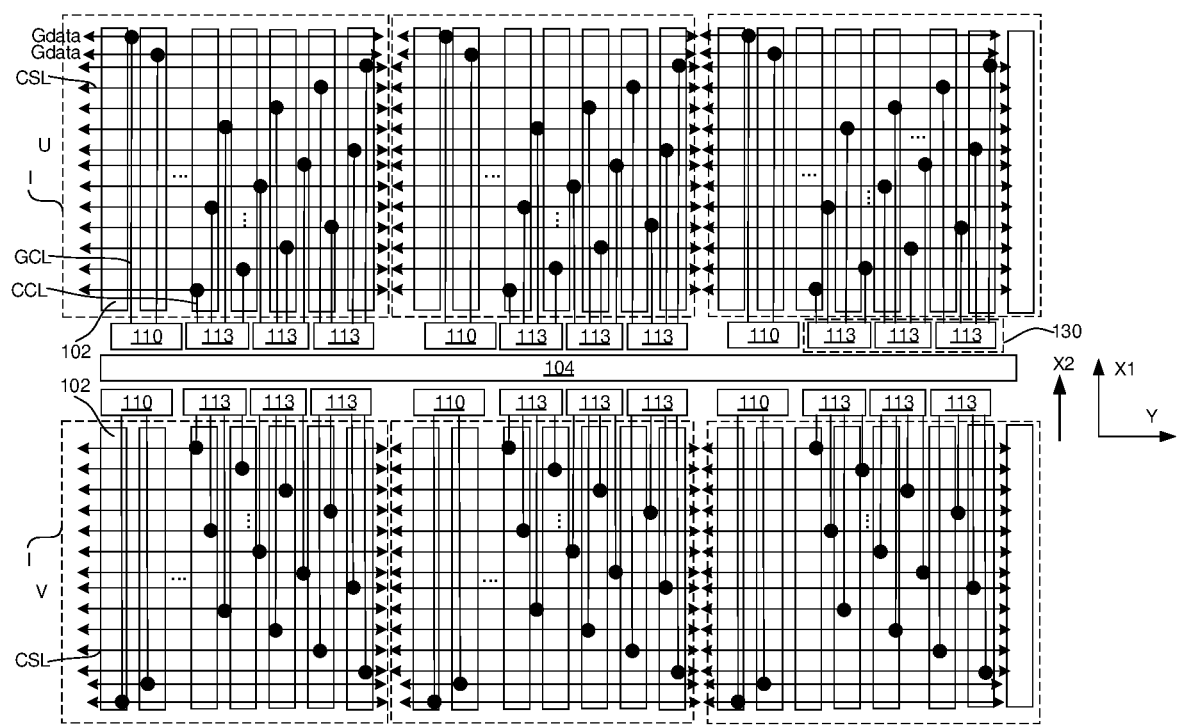
FIG. 8 is a third different schematic structural diagram of a memory according to an embodiment of the present disclosure.

Accordingly, referring to FIG. 8, the column selection circuit 103 may include at least two column selection modules 130 arranged along the first direction Y, and each of the at least two column selection modules 130 is located on one side of a corresponding module region I, and is electrically connected to a corresponding CSL through the CCL. The read-write control driver circuit 101 may include at least two read-write control driving modules 110 arranged along the first direction Y, and each of the at least two read-write control driving modules 110 is located on one side of a corresponding module region I, and is electrically connected to a corresponding global data line Gdata through the GCL.

It should be noted that FIG. 8 to FIG. 12 do not show the amplifier array, the memory cell, the amplification unit, the WL, or the BL, and only show the memory array in a form of a box, and an amplifier array between adjacent memory arrays is not shown. For arrangement of the amplifier array, the memory cell, the amplification unit, the WL, and the BL, reference may be made to the corresponding description in FIG. 2 to FIG. 7.

Specifically, each of the at least two module regions I contains a same quantity of memory modules 102. In addition, the memory may further be divided into a high-bit address memory bank U and a low-bit address memory bank V. The high-bit address memory bank U and the low-bit address memory bank V each include a plurality of memory modules 102.

Memory cells 21 in different module regions I are connected to different WLs, in other words, a WL in a module region I is enabled while WLs in other module regions I are not enabled. In this case, because different module regions I have mutually independent global data lines Gdata, the read-write control driving module 110 may select only a global data line Gdata corresponding to a module region I corresponding to the enabled WL to drive a memory module 102 in the module region I, while other module regions I do not need to be driven by the read-write control driving module 110, which can reduce more power consumption. Moreover, a scheme in which each of the at least two module regions I has a mutually independent global data line Gdata can reduce a length of each global data line Gdata, which is conducive to reducing resistance of the global data line Gdata. Moreover, load on each global data line Gdata is reduced, which is conducive to reducing a heat loss and power consumption. It can be understood that the load includes the memory module 102 electrically connected to the global data line Gdata.

In this case, different module regions I have mutually independent CSLs, only a CSL corresponding to a module region I corresponding to an enabled WL can be selected to transmit the column selection signal, while CSLs corresponding to other module regions I may not be used to transmit the column selection signal, which can reduce more power consumption. Moreover, a scheme in which each of the at least two module regions I has a mutually independent CSL can reduce the length of each of the CSL, which is conducive to reducing resistance of the CSL. Moreover, load on each of the CSLs is reduced, which is conducive to reducing a heat loss and power consumption. It can be understood that the load includes the amplification unit electrically connected to the CSL.

Figure 11:
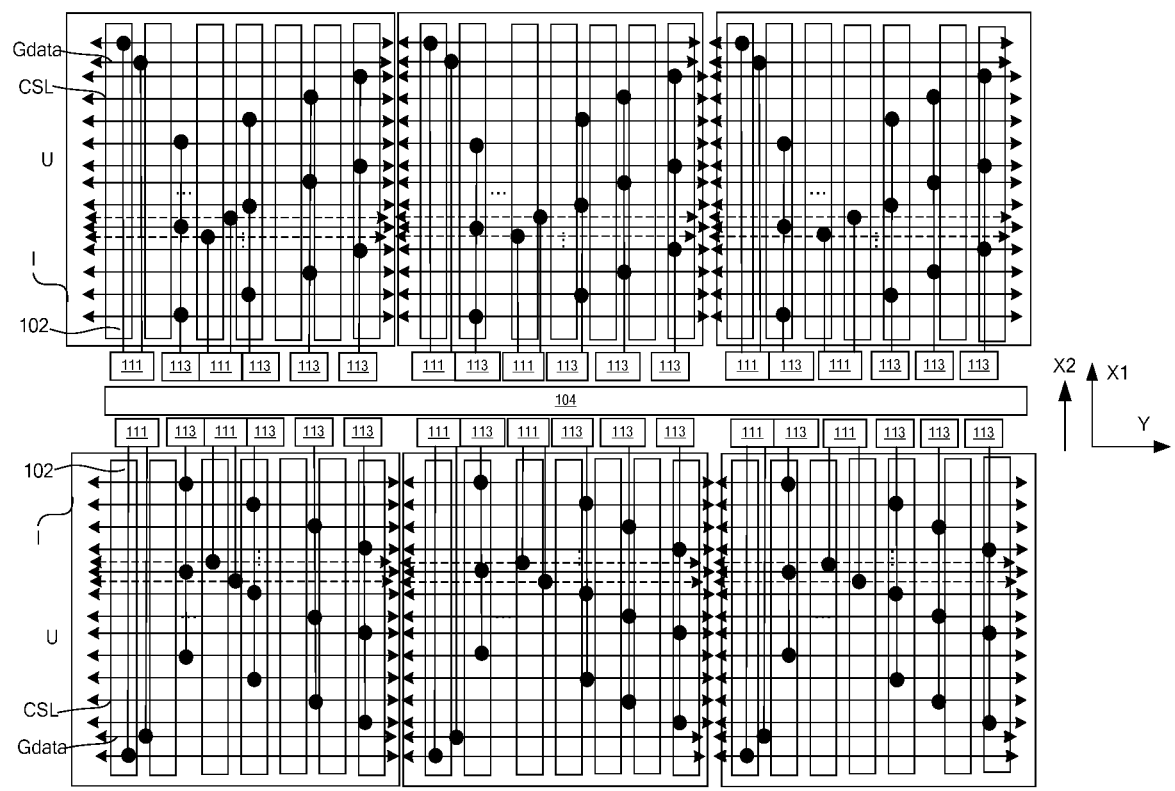
FIG. 11 is a sixth different schematic structural diagram of a memory according to an embodiment of the present disclosure.

As shown in FIG. 8, in some embodiments, there may be two module regions I. As shown in FIG. 11, in other embodiments, there may alternatively be three module regions I. It can be understood that a quantity of module regions I may be reasonably set based on an actual situation, and the quantity of module regions I is not limited in this embodiment of the present disclosure.

In some embodiments, as shown in FIG. 8 to FIG. 11, global data lines Gdata of different module regions I can be independent of each other.

Figure 12:
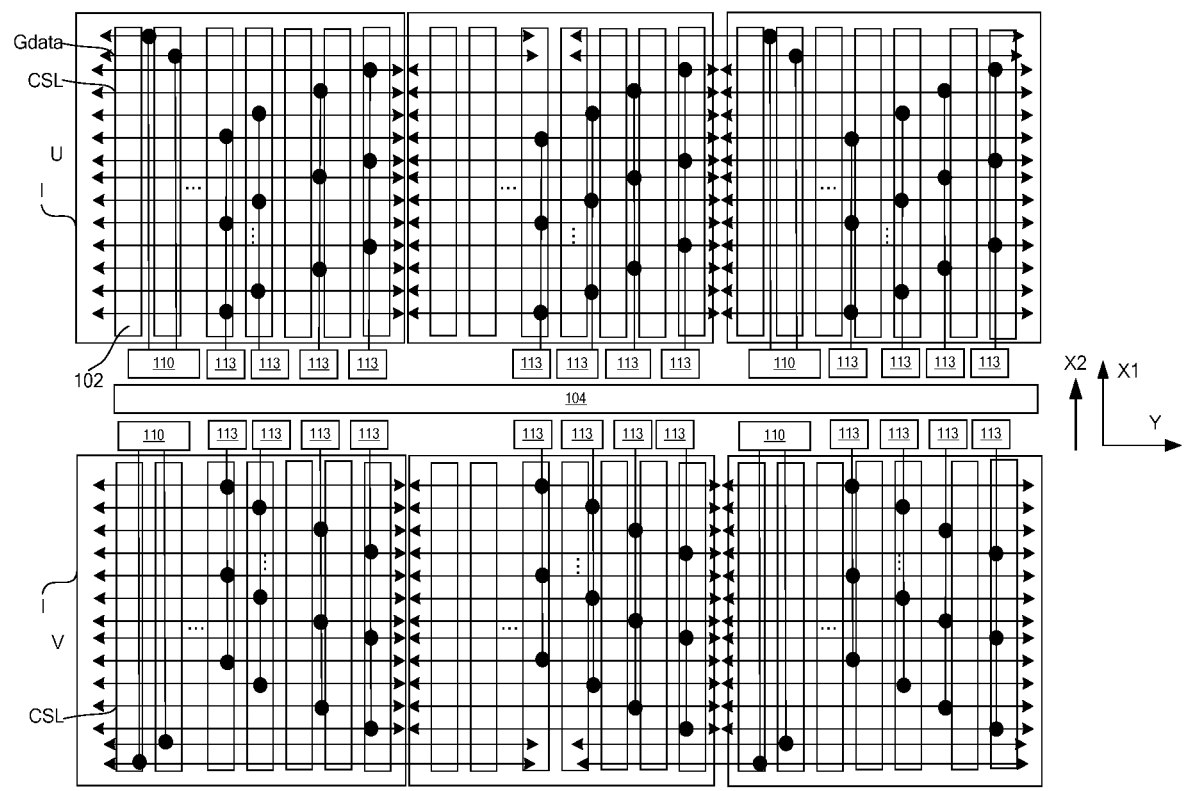
FIG. 12 is a seventh different schematic structural diagram of a memory according to an embodiment of the present disclosure.

In some embodiments, as shown in FIG. 12, the global data line Gdata corresponds to the at least two module regions I, and at least some memory modules 102, in the at least two module regions I, connected to a same global data line Gdata share the global data line. For example, the global data line Gdata may correspond to the at least two module regions, and at least some memory modules 102, in the at least two module regions I, connected to a same global data line Gdata share the global data line Gdata. In this way, the global data line Gdata can be shared by adjacent module regions I, which is conducive to reducing a quantity of global data lines Gdata, and the read-write control driving module 110 can be shared by the adjacent module regions I.

In some embodiments, the column selection circuit 103 may be configured to: when a WL corresponding to the module region is enabled, the column selection module 130 corresponding to the module region I drives the amplification unit 22 in the module region I through the CSL; and the read-write control driver circuit 101 is configured to: when the WL corresponding to the module region is enabled, the read-write control driving module 110 corresponding to the module region I drives the memory module in the module region I through the global data line Gdata. As can be seen above, this is conducive to reducing the power consumption of the memory.

Figure 9:
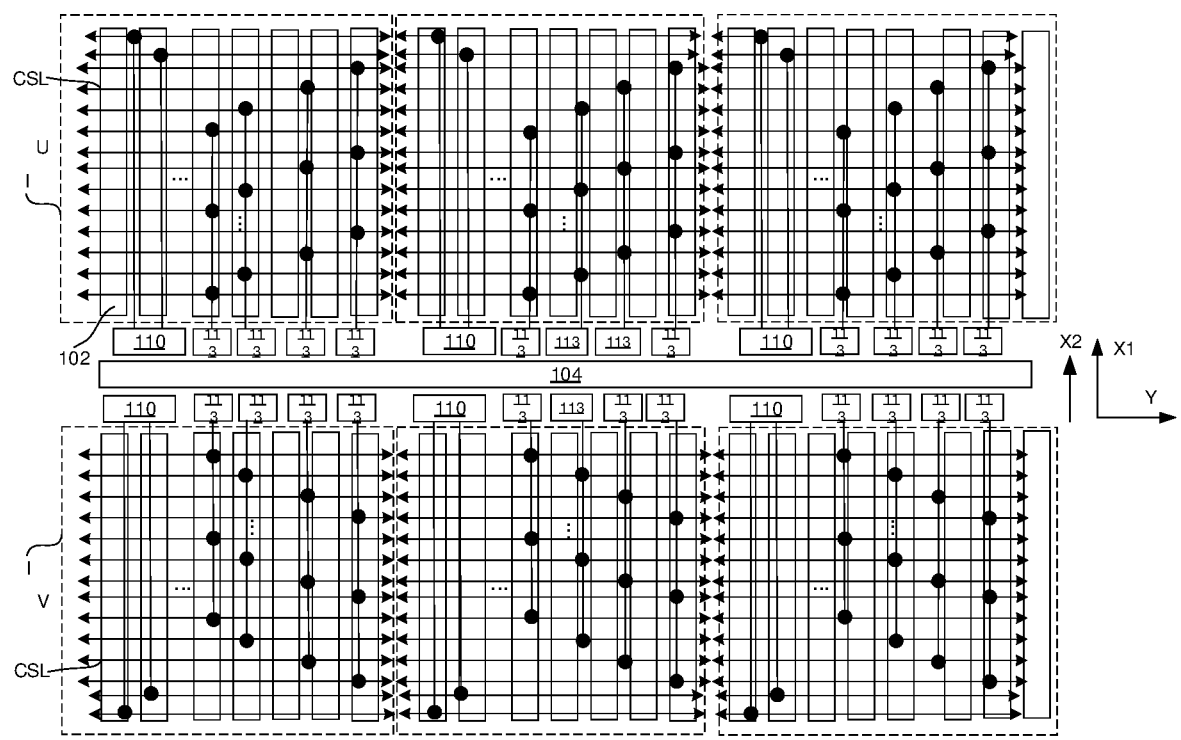
FIG. 9 is a fourth different schematic structural diagram of a memory according to an embodiment of the present disclosure.
Figure 10:
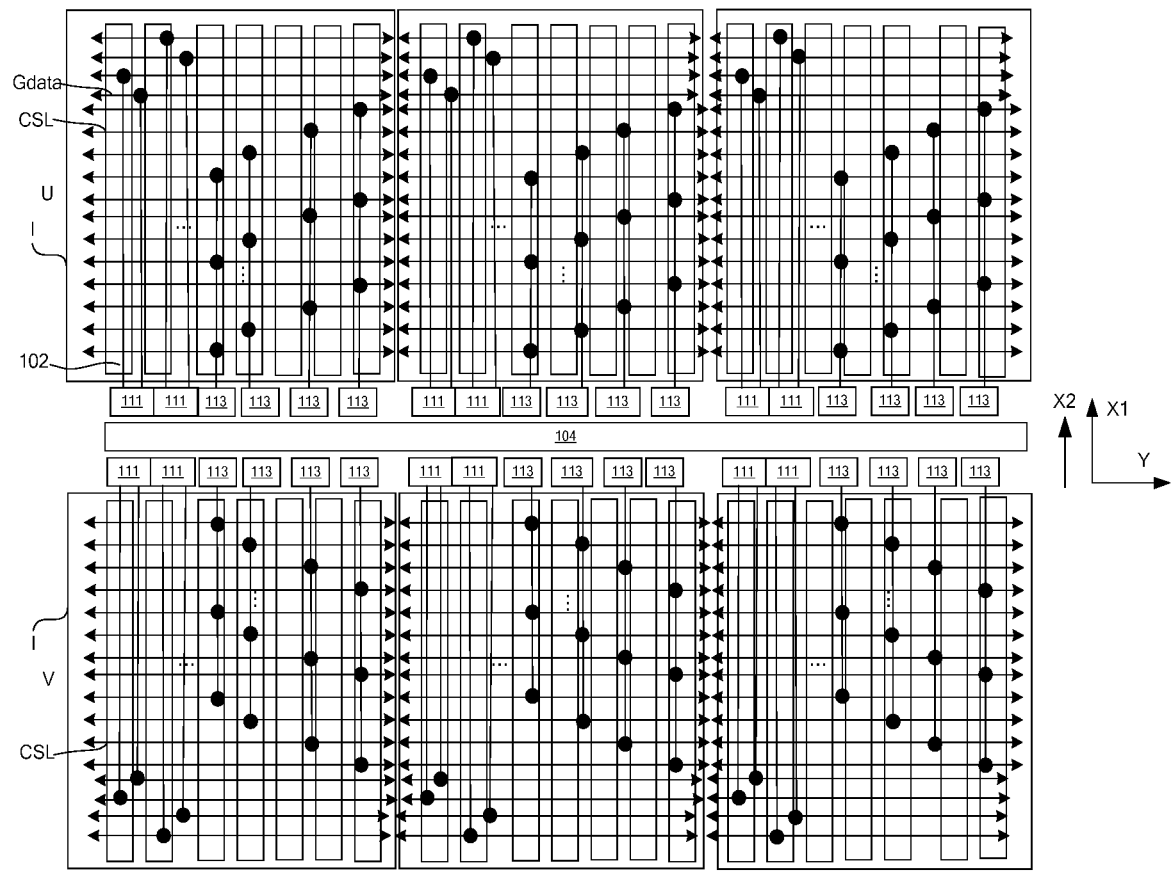
FIG. 10 is a fifth different schematic structural diagram of a memory according to an embodiment of the present disclosure.

In some embodiments, as shown in FIG. 8, for a same module region I, a quantity of CCLs is the same as that of CSLs, and each of the CCLs is electrically connected to one of the CSLs. In other embodiments, as shown in FIG. 9 to FIG. 11, for a same module region I, a same CCL is electrically connected to at least two of the CSLs.

As shown in FIG. 8, the column selection module 130 may include at least two column selection units 113 arranged along the first direction, and each of the at least two column selection units 113 is electrically connected to at least two of the CSLs through the CCL. In other words, the quantity of CCLs is less than that of CSLs. In this way, different CSLs can be electrically connected to a same CCL, in other words, amplification units in different sections can be driven/enabled by a same column selection signal. This is helpful to reduce circuit complexity of the corresponding column selection circuit 103 and the chip area.

For a same module region I, each of the at least two column selection units 113 is electrically connected to at least two adjacent CSLs through the CCL. Each of the at least two column selection units 113 may alternatively be electrically connected to at least two adjacent CSLs through a same CCL. It can be understood that each of the at least two column selection units 113 may be electrically connected to at least two adjacent CSLs through different CCLs.

In other embodiments, as shown in FIG. 8, for a same module region I, each of the at least two column selection units 113 is electrically connected to at least two CSLs distributed at intervals through the CCL. That is, each of the at least two column selection units 113 can enable amplification units in sections distributed at intervals in the same module region I. This can prevent a too small distance between CSLs transmitting a same column selection signal, so as to avoid signal crosstalk. Specifically, each of the at least two column selection units 113 may be electrically connected to at least two CSLs distributed at intervals through different CCLs. Each of the at least two column selection units 113 may alternatively be electrically connected to at least two CSLs distributed at intervals through a same CCL.

In addition, it can be understood that each of the at least two column selection units 113 may be electrically connected to at least two of the CSLs through a same CCL; or each of the at least two column selection units 113 may be electrically connected to at least two of the CSLs through different CCLs.

Referring to FIG. 10 and FIG. 11, in some embodiments, there are a plurality of global data lines Gdata in a same module region I, the plurality of global data lines Gdata are divided into at least two groups of global data lines Gdata, and each of the at least two groups of global data lines Gdata corresponds to at least two adjacent memory modules 102. The memory modules 102 corresponding to the two groups of global data lines Gdata can be driven by the read-write control driver circuit 101 separately, realizing more flexible driving manners for different memory modules 102. In addition, each group of global data lines Gdata corresponds to at least two adjacent memory modules 102 to ensure that the adjacent memory modules 102 can be driven at the same time.

Specifically, in some embodiments, referring to FIG. 10, for the same module region I, all global data lines Gdata may be arranged next to each other. In this way, there is no need to consider layout interference between the global data line Gdata and the CSL.

In other embodiments, referring to FIG. 11, for the same module region I, different groups of global data lines Gdata may be distributed at intervals. Different groups of global data lines Gdata are spaced from each other, which can avoid signal interference between the different groups of global data lines Gdata. It should be noted that in order to facilitate illustration, a group of global data lines Gdata is represented by a dotted line with an arrow in FIG. 11.

Referring to FIG. 10 and FIG. 11, in some embodiments, for a same module region I, the read-write control driving module (not shown in the figure) may include a plurality of read-write control driving units 111 arranged along the first direction Y, and each of the plurality of read-write control driving units 111 is electrically connected to at least one group of global data lines Gdata. In this way, different memory modules 102 in a same module region I can be independently driven by different read-write control driving units 111. In addition, global data lines Gdata connected to different read-write control driving units 111 may be distributed at intervals, which can avoid signal interference between different groups of global data lines Gdata, and further improve the storage performance of the memory. It should be noted that only two module regions I are shown in FIG. 10. The quantity of module regions I is not limited in this embodiment of the present disclosure. There may be three, four, or more module regions I.

In addition, for a same module region I, the column selection unit 113 and the read-write control driving unit 111 may be alternately arranged at intervals, such that the CSL and the global data line Gdata can be arranged more flexibly.

An embodiment of the present disclosure provides a memory with a superior structure and superior performance. A column selection circuit 103 and a read-write control driver circuit 101 are arranged on one side of a plurality of memory modules 102 as a whole and are not arranged in an arrangement direction of the plurality of memory modules 102, which makes a chip design of the memory more flexible and helps to reduce chip area. A global data line Gdata, a GCL, and the read-write control driver circuit 101 form a T-shape structure to reduce time required for transmitting a column selection signal to an amplification unit 22 far away from the read-write control driver circuit 101. This is conducive to solving an RC delay problem and improving read-write performance of the memory. In addition, the column selection circuit 103, a CSL, and a CCL form a T-shape structure to reduce the time required for transmitting the column selection signal to the amplification unit 22 far away from the read-write control driver circuit 101. This is conducive to reducing the RC delay problem and improving the read-write performance of the memory.

The technical solutions provided in the embodiments of the present disclosure have the following advantages:

The embodiments of the disclosure provide a memory with a superior structure and superior performance. A plurality of memory modules are arranged along a first direction. A read-write control driver circuit and a column selection circuit are located on a same side of the plurality of memory modules, and an arrangement direction of the plurality of memory modules and an arrangement direction of the read-write control driver circuit are different from the first direction. A global data line extends along the first direction, a GCL extends along a third direction, and the global data line is electrically connected to the read-write control driver circuit through the GCL. The read-write control driver circuit is configured to drive a memory module corresponding to the global data line. A CSL extends along the first direction, a CCL extends along the third direction, and the CSL is electrically connected to the column selection circuit through the CCL. The position setting of the read-write control driver circuit and the column selection circuit makes a chip layout corresponding to the memory more flexible. In addition, the global data line and the GCL form a T-shape structure. In this way, a difference between signal transmission paths required by the read-write control driver circuit to drive head-end and tail-end memory modules is small, which solves an RC delay problem of the read-write control driver circuit and is conducive to improving a read-write speed of the memory. Moreover, the column selection circuit, the CCL, and the CSL form a T-shape structure, and a difference between signal transmission paths required by the column selection circuit to drive the head-end and tail-end memory modules is small, which reduces an RC delay of the column selection circuit and is conducive to improving the read-write speed of the memory.

Those skilled in the art can understand that the above implementations are specific embodiments for implementing the present disclosure. In practical applications, various changes may be made to the above embodiments in terms of form and details without departing from the spirit and scope of the present disclosure. Any person skilled in the art may make changes and modifications to the embodiments without departing from the spirit and scope of the present disclosure. Therefore, the protection scope of the present disclosure should be subject to the scope defined by the claims.

What is claimed is:

1. A memory, comprising:
   bit lines extending along a first direction and word lines extending along a second direction;
   a plurality of memory modules arranged along the first direction, wherein each of the plurality of memory modules comprises a memory array and an amplifier array that are arranged along the first direction, the memory array comprises at least one memory cell, the amplifier array comprises at least one amplification unit, each of the bit lines is electrically connected to one terminal of a corresponding amplification unit, and each of the word lines is electrically connected to a corresponding memory cell, wherein the plurality of memory modules are divided into at least two module regions arranged along the first direction, and each of the at least two module regions comprises at least two of the plurality of memory modules;
   a column selection circuit and a read-write control driver circuit, wherein the column selection circuit and the read-write control driver circuit are located on a same side of the plurality of memory modules perpendicular to the first direction;
   column-select lines extending along the first direction and column connection lines extending along a third direction, wherein each of the column-select lines is electrically connected to the amplification unit arranged along the first direction and is electrically connected to the column selection circuit through the column connection line, and the column selection circuit is configured to drive the amplification unit electrically connected to the column-select line; and
   a global data line extending along the first direction and a global connection line extending along the third direction, wherein the global data line is electrically connected to the read-write control driver circuit through the global connection line, and the read-write control driver circuit is configured to drive a memory module corresponding to the global data line to write data into the memory cell through the global data line, or to read data from the memory cell and transmit the data to the global data line;
   wherein the column selection circuit comprises at least two column selection modules arranged along the first direction, each of the at least two column selection modules is located on one side of a corresponding module region, and is electrically connected to a corresponding column-select line through the column connection line, and the read-write control driver circuit comprises at least two read-write control driving modules arranged along the first direction, wherein each of the at least two read-write control driving modules is located on one side of a corresponding module region, and is electrically connected to a corresponding global data line through the global connection line; and
   wherein a plurality of global data lines of different module regions are independent of each other; or the global data line corresponds to the at least two module regions, and at least some memory modules, in the at least two module regions, connected and share to the global data line.

2. The memory according to claim 1, wherein the column selection circuit and the read-write control driver circuit are arranged along the first direction.

3. The memory according to claim 1, wherein each of the column-select lines is electrically connected to a plurality of columns of amplification units arranged along the first direction.

4. The memory according to claim 3, wherein the column selection circuit comprises a plurality of column selection units arranged along the first direction, and each of the plurality of column selection units is electrically connected to at least two of the column-select lines through the column connection lines, wherein each of the plurality of column selection units is electrically connected to at least two adjacent column-select lines through the column connection lines, or each of the plurality of column selection units is electrically connected to at least two column-select lines distributed at intervals through the column connection lines.

5. The memory according to claim 1, wherein in the first direction, the plurality of memory modules are sorted by natural number in ascending order, a memory module in an odd position is defined as a first memory module, and a memory module in an even position is defined as a second memory module; and the global data line comprises:
a first global data line corresponding to the first memory module; and
a second global data line corresponding to the second memory module; and
the global connection line comprises:
a first global connection line, wherein the first global connection line is electrically connected to the first global data line and the read-write control driver circuit; and
a second global connection line, wherein the second global connection line is electrically connected to the second global data line and the read-write control driver circuit.

6. The memory according to claim 5, wherein each first global data line corresponds to all first memory modules, and each second global data line corresponds to all second memory modules.

7. The memory according to claim 5, wherein there are a plurality of first global data lines and a plurality of second global data lines, wherein each of the plurality of first global data lines corresponds to some first memory modules, and each of the plurality of second global data lines corresponds to some second memory modules.

8. The memory according to claim 7, wherein the read-write control driver circuit comprises:
a plurality of read-write control driving units arranged along the first direction, wherein each of the plurality of read-write control driving units is electrically connected to at least one of the plurality of first global data lines and at least one of the plurality of second global data lines.

9. The memory according to claim 1, wherein the column selection circuit is configured to: when a word line corresponding to the module region is enabled, the column selection module corresponding to the module region drives the amplification unit in the module region through the column-select line; and the read-write control driver circuit is configured to: when the word line corresponding to the module region is enabled, the read-write control driving module corresponding to the module region drives the memory module in the module region through the global data line.

10. The memory according to claim 1, wherein for a same module region, a quantity of column connection lines is the same as a quantity of column-select lines, and each of the column connection lines is electrically connected to one of the column-select lines; or for a same module region, a same column connection line is electrically connected to at least two of the column-select lines.

11. The memory according to claim 1, wherein the column selection module comprises at least two column selection units arranged along the first direction, and each of the at least two column selection units is electrically connected to at least two of the column-select lines through the column connection lines.

12. The memory according to claim 11, wherein for a same module region, each of the at least two column selection units is electrically connected to at least two adjacent column-select lines through the column connection lines; or for a same module region, each of the at least two column selection units is electrically connected to at least two column-select lines distributed at intervals through the column connection lines.

13. The memory according to claim 11, wherein each of the at least two column selection units is electrically connected to at least two of the column-select lines through a same column connection line; or each of the at least two column selection units is electrically connected to at least two of the column-select lines through different column connection lines.

14. The memory according to claim 1, wherein there are a plurality of global data lines in a same module region, the plurality of global data lines are divided into at least two groups of global data lines, and each of the at least two groups of global data lines corresponds to at least two adjacent memory modules.

15. The memory according to claim 14, wherein for the same module region, all the global data lines are arranged next to each other, or different groups of global data lines are distributed at intervals.

16. The memory according to claim 1, wherein for a same module region, the read-write control driving module comprises a plurality of read-write control driving units arranged along the first direction, and each of the plurality of read-write control driving units is electrically connected to at least one group of global data lines.

17. The memory according to claim 1, wherein the first direction is perpendicular to the third direction; and the second direction is the same as the third direction.

18. The memory according to claim 1, further comprising a row decoding circuit, wherein the row decoding circuit is configured to select, based on the word line, the memory cell electrically connected to the word line; and the row decoding circuit is located on one side of the column selection circuit and the read-write control driver circuit distal from the plurality of memory modules.

19. A memory, comprising:
bit lines extending along a first direction and word lines extending along a second direction;
a plurality of memory modules arranged along the first direction, wherein each of the plurality of memory modules comprises a memory array and an amplifier array that are arranged along the first direction, the memory array comprises at least one memory cell, the amplifier array comprises at least one amplification unit, each of the bit lines is electrically connected to one terminal of a corresponding amplification unit, and each of the word lines is electrically connected to a corresponding memory cell, wherein the plurality of memory modules are divided into at least two module regions arranged along the first direction, and each of the at least two module regions comprises at least two of the plurality of memory modules;
a column selection circuit and a read-write control driver circuit, wherein the column selection circuit and the read-write control driver circuit are located on a same side of the plurality of memory modules perpendicular to the first direction;
column-select lines extending along the first direction and column connection lines extending along a third direction, wherein each of the column-select lines is electrically connected to the amplification unit arranged along the first direction and is electrically connected to the column selection circuit through the column connection line, and the column selection circuit is configured to drive the amplification unit electrically connected to the column-select line; and
a global data line extending along the first direction and a global connection line extending along the third direction, wherein the global data line is electrically connected to the read-write control driver circuit through the global connection line, and the read-write control driver circuit is configured to drive a memory module corresponding to the global data line to write data into the memory cell through the global data line, or to read data from the memory cell and transmit the data to the global data line;
wherein the column selection circuit comprises at least two column selection modules arranged along the first direction, each of the at least two column selection modules is located on one side of a corresponding module region, and is electrically connected to a corresponding column-select line through the column connection line, and the read-write control driver circuit comprises at least two read-write control driving modules arranged along the first direction, wherein each of the at least two read-write control driving modules is located on one side of a corresponding module region, and is electrically connected to a corresponding global data line through the global connection line; and
wherein for a same module region, a quantity of column connection lines is the same as a quantity of column-select lines, and each of the column connection lines is electrically connected to one of the column-select lines; or for a same module region, a same column connection line is electrically connected to at least two of the column-select lines.

20. A memory, comprising:
bit lines extending along a first direction and word lines extending along a second direction;
a plurality of memory modules arranged along the first direction, wherein each of the plurality of memory modules comprises a memory array and an amplifier array that are arranged along the first direction, the memory array comprises at least one memory cell, the amplifier array comprises at least one amplification unit, each of the bit lines is electrically connected to one terminal of a corresponding amplification unit, and each of the word lines is electrically connected to a corresponding memory cell, wherein the plurality of memory modules are divided into at least two module regions arranged along the first direction, and each of the at least two module regions comprises at least two of the plurality of memory modules;
a column selection circuit and a read-write control driver circuit, wherein the column selection circuit and the read-write control driver circuit are located on a same side of the plurality of memory modules perpendicular to the first direction;
column-select lines extending along the first direction and column connection lines extending along a third direction, wherein each of the column-select lines is electrically connected to the amplification unit arranged along the first direction and is electrically connected to the column selection circuit through the column connection line, and the column selection circuit is configured to drive the amplification unit electrically connected to the column-select line; and
a global data line extending along the first direction and a global connection line extending along the third direction, wherein the global data line is electrically connected to the read-write control driver circuit through the global connection line, and the read-write control driver circuit is configured to drive a memory module corresponding to the global data line to write data into the memory cell through the global data line, or to read data from the memory cell and transmit the data to the global data line;
wherein the column selection circuit comprises at least two column selection modules arranged along the first direction, each of the at least two column selection modules is located on one side of a corresponding module region, and is electrically connected to a corresponding column-select line through the column connection line, and the read-write control driver circuit comprises at least two read-write control driving modules arranged along the first direction, wherein each of the at least two read-write control driving modules is located on one side of a corresponding module region, and is electrically connected to a corresponding global data line through the global connection line; and
wherein the column selection module comprises at least two column selection units arranged along the first direction, and each of the at least two column selection units is electrically connected to at least two of the column-select lines through the column connection lines.

* * * * *